(12) United States Patent
Joshi et al.

(10) Patent No.: US 7,525,179 B2
(45) Date of Patent: Apr. 28, 2009

(54) LEAD FRAME STRUCTURE WITH APERTURE OR GROOVE FOR FLIP CHIP IN A LEADED MOLDED PACKAGE

(75) Inventors: Rajeev Joshi, Cupertino, CA (US); Chung-Lin Wu, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 72 days.

(21) Appl. No.: 11/448,962

(22) Filed: Jun. 6, 2006

(65) Prior Publication Data

US 2006/0284291 A1    Dec. 21, 2006

Related U.S. Application Data

(62) Division of application No. 11/051,061, filed on Feb. 4, 2005, now Pat. No. 7,081,666, which is a division of application No. 10/411,688, filed on Apr. 11, 2003, now Pat. No. 6,867,481.

(51) Int. Cl.
*H01L 23/495*    (2006.01)
*H01L 23/28*    (2006.01)

(52) U.S. Cl. ............................. 257/666; 257/E23.033; 257/E23.069; 257/669; 257/671; 257/672; 257/674; 257/696; 257/698; 257/712; 257/713; 257/E23.046; 257/676; 257/778

(58) Field of Classification Search ............... 257/666, 257/676, 778, E23.039, E21.504, 669, 671, 257/672, 674, 696, 730, 712, 713, E23.033, 257/E23.069, E23.046; 438/123, 108
See application file for complete search history.

(56) References Cited

U.S. PATENT DOCUMENTS

| | | | |
|---|---|---|---|
| 4,942,452 A | 7/1990 | Kitano et al. |
| 4,942,454 A | 7/1990 | Mori et al. |
| 5,105,259 A | 4/1992 | McShane et al. |
| 5,150,193 A | 9/1992 | Yasuhara et al. |
| 5,397,915 A | 3/1995 | Nose |
| 5,637,913 A | 6/1997 | Kajihara et al. |

(Continued)

FOREIGN PATENT DOCUMENTS

EP    0 890 545 A1    1/1999

(Continued)

OTHER PUBLICATIONS

U.S. Appl. No. 10/413,668, filed Apr. 13, 2003, Cabahug et al.

(Continued)

*Primary Examiner*—Alexander O Williams
(74) *Attorney, Agent, or Firm*—Townsend and Townsend and Crew LLP

(57) ABSTRACT

A semiconductor die package is disclosed. In one embodiment, the die package includes a semiconductor die including a first surface and a second surface, and a leadframe structure having a die attach region and a plurality of leads extending away from the die attach region. The die attach region includes one or more apertures. A molding material is around at least portions of the die attach region of the leadframe structure and the semiconductor die. The molding material is also within the one or more apertures.

18 Claims, 9 Drawing Sheets

U.S. PATENT DOCUMENTS

| | | | |
|---|---|---|---|
| 5,637,916 | A | 6/1997 | Joshi |
| 5,659,199 | A | 8/1997 | Mori et al. |
| 5,708,294 | A | 1/1998 | Toriyama |
| 5,765,280 | A | 6/1998 | Joshi |
| 5,789,809 | A | 8/1998 | Joshi |
| 5,874,773 | A | 2/1999 | Terada et al. |
| 5,920,116 | A | 7/1999 | Umehara et al. |
| 6,133,634 | A | 10/2000 | Joshi |
| 6,191,490 | B1 | 2/2001 | Huang |
| 6,294,403 | B1 | 9/2001 | Joshi |
| 6,329,706 | B1 | 12/2001 | Nam |
| RE37,690 | E | 5/2002 | Kitano et al. |
| 6,469,384 | B2 | 10/2002 | Joshi |
| 6,489,678 | B1 | 12/2002 | Joshi |
| 6,566,749 | B1 | 5/2003 | Joshi et al. |
| 6,624,522 | B2 | 9/2003 | Standing et al. |
| 6,867,481 | B2 | 3/2005 | Joshi et al. |
| 6,943,434 | B2 | 9/2005 | Tangpuz et al. |
| 6,989,588 | B2 | 1/2006 | Quinones et al. |
| 2001/0007780 | A1 | 7/2001 | Minamio et al. |
| 2001/0054640 | A1 | 12/2001 | Takahashi |
| 2002/0065661 | A1 | 5/2002 | Everhart et al. |
| 2002/0066950 | A1 | 6/2002 | Joshi |
| 2002/0066959 | A1 | 6/2002 | Joshi |
| 2002/0100962 | A1 | 8/2002 | Joshi |
| 2002/0192935 | A1 | 12/2002 | Joshi et al. |
| 2003/0001244 | A1 | 1/2003 | Araki et al. |
| 2003/0011005 | A1 | 1/2003 | Joshi |
| 2003/0025183 | A1 | 2/2003 | Thornton et al. |
| 2003/0042403 | A1 | 3/2003 | Joshi |
| 2003/0075786 | A1 | 4/2003 | Joshi et al. |
| 2003/0107126 | A1 | 6/2003 | Joshi |
| 2003/0122247 | A1 | 7/2003 | Joshi |
| 2003/0234446 | A1 | 12/2003 | Diot et al. |
| 2004/0063240 | A1 | 4/2004 | Madrid et al. |
| 2004/0104489 | A1 | 6/2004 | Larking |
| 2004/0130009 | A1 | 7/2004 | Tangpuz et al. |
| 2004/0224438 | A1 | 11/2004 | Standing et al. |
| 2005/0130350 | A1 | 6/2005 | Estacio et al. |

FOREIGN PATENT DOCUMENTS

| | | |
|---|---|---|
| FR | 2138685 A | 1/1973 |
| JP | 6-21317 | 1/1994 |

OTHER PUBLICATIONS

"Test Method A105-B: Power and Temperature Cycling, EIA/JESD 22-A105-B," EIA/JEDEC Standard, Electronic Industries Association, (Feb. 1996).

"Preconditioning of Nonhermetic Surface Mount Devices Prior to Reliability Testing", JESD22-A113-B, EIA/JEDEC Standard, Electronic Industries Association, (Mar. 1999).

"Temperature Cycling, JESD22-A104-B," JEDEC Standard, JEDEC Solid State Technology Association, (Jul. 2000).

"Accelerated Moisture Resistance—Unbiased Autoclave, JESD22-A102-C", JEDEC Standard, JEDEC Solid State Technology Association, (Dec. 2000).

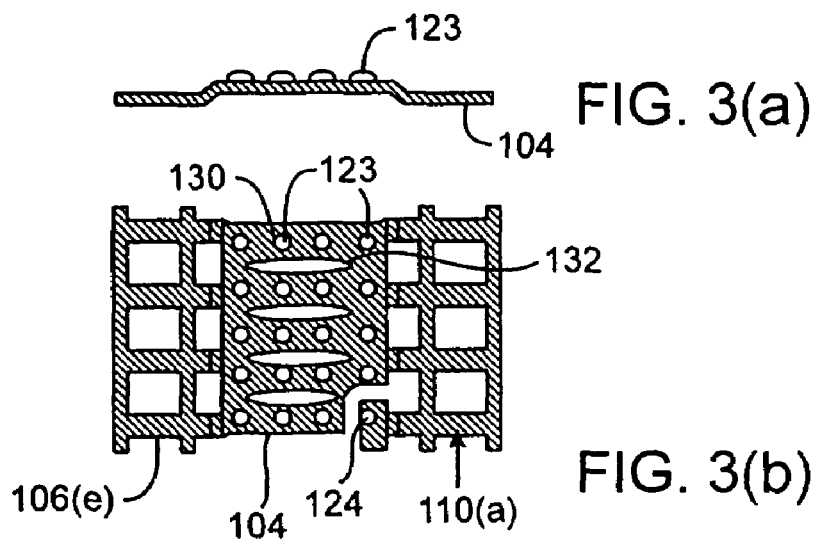
FIG. 3(a)
FIG. 3(b)
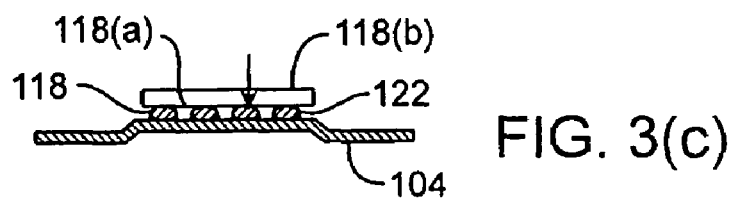
FIG. 3(c)
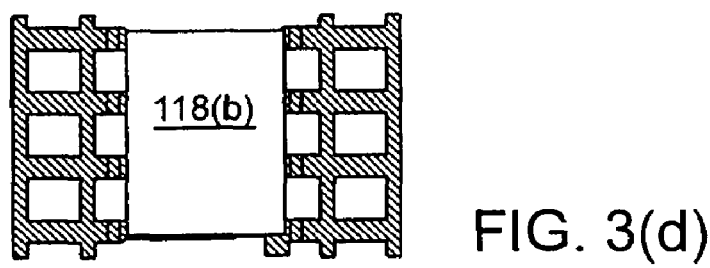
FIG. 3(d)
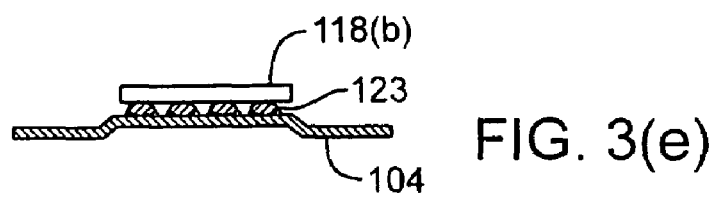
FIG. 3(e)
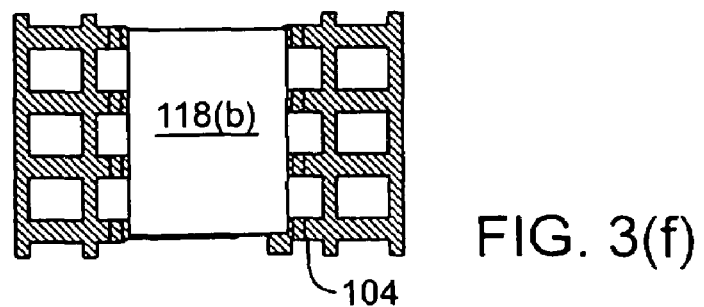
FIG. 3(f)

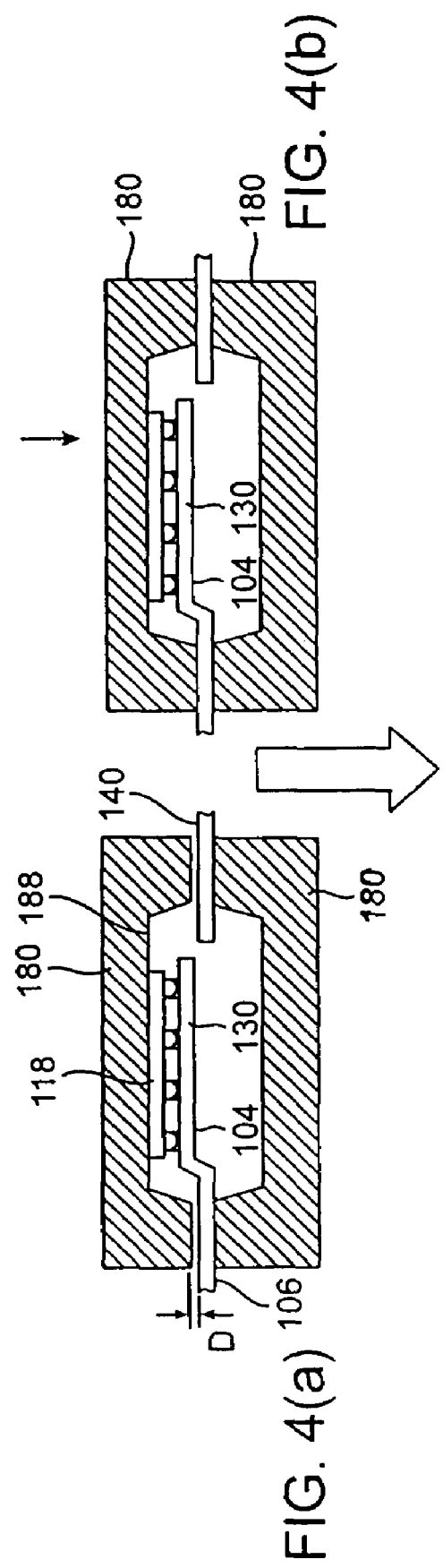
FIG. 4(a)
FIG. 4(b)
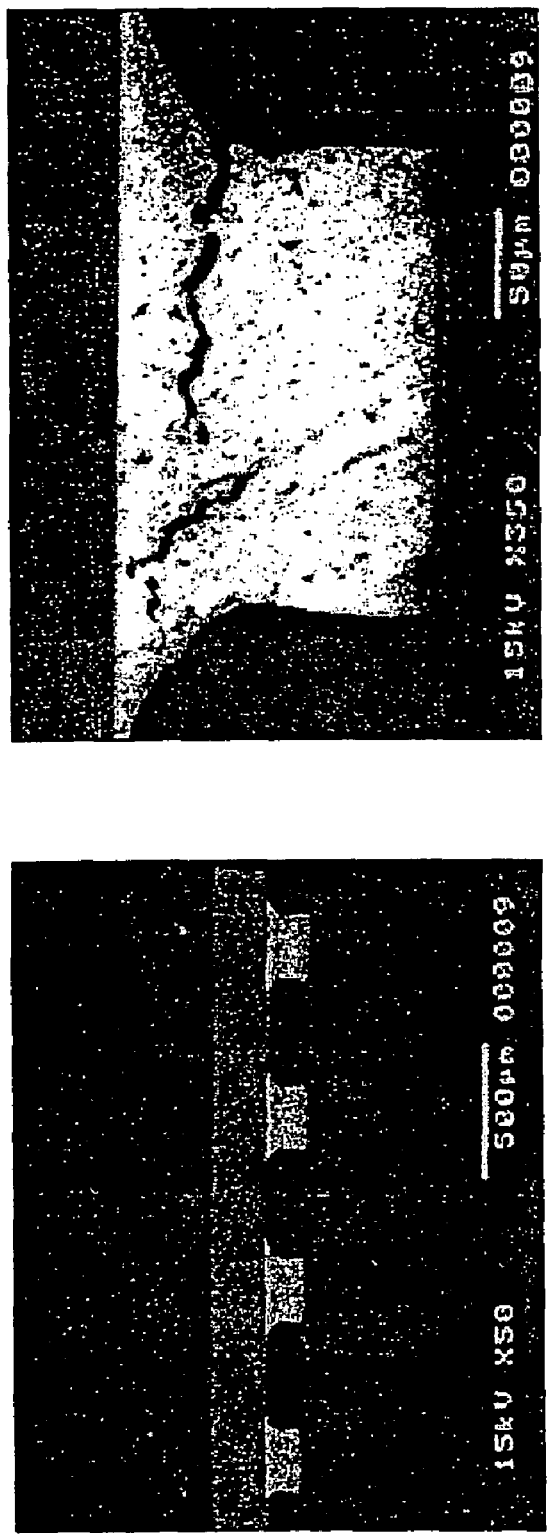
FIG. 4(c)
FIG. 4(d)

|  |  | Qual Lot 1<br>70CDW, Z002PS2RMK, 3S | Qual Lot 2<br>DAKPW, Z001GJ50ZQ, 3S | Qual Lot 3<br>BACEW, Z0A1CU68ZQ, 3S |
|---|---|---|---|---|
| Unit Level | | | | |
| ACLV<br>@ 121oC, 15psig,<br>100% RH, Precon L-1 | After Precon | 0/79 | 0/79 | 0/79 |
| | 48 hrs | 0/79 | 0/79 | 0/79 |
| | 96 hrs | 0/79 | 0/79 | 0/79 |
| TMCL<br>@ -65 to 150oC,<br>15min dwell, Precon L-1 | After Precon | 0/79 | 0/79 | 0/79 |
| | 100 cyc | 0/79 | 0/79 | 0/79 |
| | 500 cyc | 0/79 | 0/79 | 0/79 |
| | 1000 cyc | 0/79 | 0/79 | 0/79 |
| Board Level | | | | |
| TMCL<br>@ -10 to 100oC, 15min dwell | 100 cyc | 0/79 | 0/79 | 0/79 |
| | 500 cyc | 0/79 | 0/79 | 0/79 |
| PRCL<br>@ 125oC, 2min On, 2min Off | 2.5K cyc | 0/79 | 0/79 | 0/79 |
| | 5K cyc | 0/79 | 0/79 | 0/79 |
| | 10K cyc (M) | 0/79 | 0/79 | 0/79 |

FIG. 8

LEAD FRAME STRUCTURE WITH APERTURE OR GROOVE FOR FLIP CHIP IN A LEADED MOLDED PACKAGE

This application is a divisional of U.S. patent application Ser. No. 11/051,061, filed on Feb. 4, 2005, which is a divisional of U.S. application Ser. No. 10/411,688, filed on Apr. 11, 2003, now U.S. Pat. No. 6,867,481, which are herein incorporated by reference in their entirety for all purposes.

BACKGROUND OF THE INVENTION

There are a number of semiconductor die packages. Low profile packages that include specific leadframe structures and specific drain clip structures are shown and described in U.S. patent application Ser. No. 10/271,654, filed Oct. 14, 2002, entitled "Thin, Thermally Enhanced Flip Chip In A Leaded Molded Package" by Rajeev Joshi and Chung-Lin Wu, which is herein incorporated by reference in its entirety for all purposes. In this patent application, a semiconductor die is mounted to a leadframe structure with solder. A drain clip is bonded to the topside of the die. The die is encapsulated with a molding material.

While such semiconductor packages are useful, improvements could be made. For example, one problem to be addressed is the problem of solder joint reliability. During the processing of the above described die package, a semiconductor die is mounted to the leadframe with solder. Solder joints are formed between the leadframe and the semiconductor die. The narrow spaces between solder joints and between the die and the leadframe need to be filled with the molding material. It is difficult to fill these narrow spaces with molding material. If the spaces are not filled with molding material, gaps can form in the semiconductor die package. The molding material may be non-uniform, and this can cause stress in the solder joints, which can cause them to fracture. Another problem to be addressed is the problem of delamination between the leadframe structure and the molding material. If the molding material and the leadframe structure do not strongly adhere to each other, they can separate from each other thus increasing the likelihood that the die package may fail over time.

Embodiments of the invention address these and other problems individually and collectively.

SUMMARY OF THE INVENTION

Embodiments of the invention are directed towards semiconductor die packages, leadframe structures for semiconductor die packages, and methods for making semiconductor die packages.

One embodiment of the invention is directed to a semiconductor die package comprising: (a) a semiconductor die including a first surface and a second surface; (b) a leadframe structure comprising a die attach region and a plurality of leads extending away from the die attach region, wherein the die attach region includes one or more apertures extending through the die attach region and being oriented generally perpendicular to the orientations of the leads in the plurality of leads, and wherein the semiconductor die is mounted on the die attach region of the leadframe structure; and (c) a molding material that is around at least portions of the die attach region of the leadframe structure and the semiconductor die, and wherein the molding material is also within the one or more apertures in the die attach region of the lead frame structure.

Another embodiment of the invention is directed to a leadframe structure comprising: a die attach region; a plurality of leads extending away from the die attach region; and one or more apertures in the die attach region and extending through the die attach region, and wherein the one or more apertures are oriented generally perpendicular to the leads in the plurality of leads.

Another embodiment of the invention is directed to a method for forming a semiconductor die package, the method comprising: (a) attaching a semiconductor die including a first surface and a second surface to a die attach region in a leadframe structure using solder, the leadframe structure comprising one or more apertures extending through the die attach region and a plurality of leads extending away from the die attach region, and wherein the one or more apertures are oriented generally perpendicular to the orientations of the leads in the plurality of leads; and (b) molding a molding material at least partially around the semiconductor die and the die attach region, wherein the molding material passes into the one or more apertures in the die attach region of the leadframe structure.

Another embodiment of the invention is directed to a semiconductor die package comprising: (a) a semiconductor die including a first surface and a second surface; (b) a leadframe structure comprising a die attach region and a plurality of leads extending away from the die attach region, wherein the die attach region includes one or more grooves in the die attach region, and wherein the semiconductor die is mounted on the die attach region of the leadframe structure using solder that is disposed in the one or more grooves; and (c) a molding material that is around at least portions of the die attach region of the leadframe structure and the semiconductor die.

These and other embodiments of the invention are described in further detail below.

BRIEF DESCRIPTION OF THE DRAWINGS

FIGS. 3(a)-3(l) show various views of a semiconductor die and a leadframe structure as they are formed into a semiconductor die package.

FIGS. 4(a)-4(b) show a semiconductor die and leadframe structure as a molding material is being applied.

FIG. 4(c) is a cross-sectional view of a semiconductor die mounted to a leadframe after molding.

FIG. 4(d) shows a cross-section view of a solder bump with a partial fracture.

FIG. 8 shows a table with data showing the reliability of embodiments of the invention.

In FIGS. 1-8, like numerals designate like elements.

DETAILED DESCRIPTION

Embodiments of the invention are directed to lead frame structures, semiconductor die packages, and methods for making semiconductor die packages. The semiconductor die packages can include a semiconductor die that is mounted to a lead frame structure using, for example, solder. If the semiconductor die includes a vertical transistor, the semiconductor die package can have a drain clip or other conductive structure connected to the semiconductor die to route the drain current from one side of the semiconductor die to the other side of the semiconductor die. A molding material can cover at least part of the semiconductor die and the leadframe structure.

The semiconductor dies used in the semiconductor die packages according to preferred embodiments of the invention include vertical power transistors. Exemplary vertical power transistors are described, for example, in U.S. Pat. Nos. 6,274,905, and 6,351,018, both of which are assigned to the same assignee as the present application, and both which are herein incorporated by reference in their entirety for all purposes. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

As used herein, the term "leadframe structure" can refer to a structure that is derived from a lead frame. A typical leadframe structure includes a source lead structure, a gate lead structure, and an optional dummy lead structure. Each of these parts of the leadframe structure are described in detail below. Each of the source lead structure, the gate lead structure, and the dummy lead structure can have one or more leads.

Figure 1A:
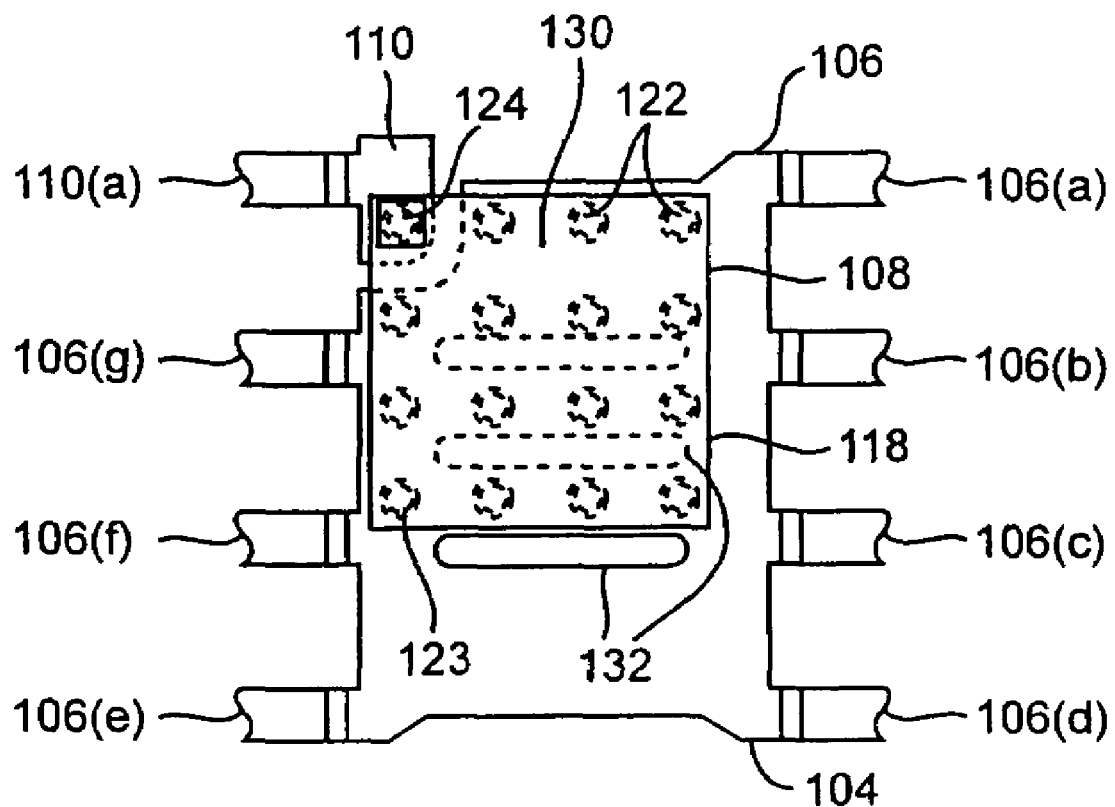
FIG. 1(a) shows a top view of a semiconductor die on a leadframe structure.

FIG. 1(a) shows a semiconductor die 118 on a leadframe structure 104. The leadframe structure 104 includes a gate lead structure 110 and a source lead structure 106. The gate lead structure 110 includes a gate lead 110(a) and the source lead structure 106 includes seven source leads 106(a)-106(g). This example shows seven source leads and one gate lead.

An array of solder joints 123 is between the semiconductor die 118 and the lead frame structure 104 and electrically and mechanically connects them together. The array of solder joints 123 includes a plurality of source solder joints 122 and a gate solder joint 124, which respectively join the source region and the gate region of a MOSFET in the semiconductor die 118 to the gate lead structure 110 and the source lead structure 106.

The leadframe structure 104 has a die attach region 130 on which the semiconductor die 118 is mounted. The die attach region 130 may be discontinuous and may comprise an inner portion of the gate lead structure 110 and an inner portion of the source lead structure 106. A number of apertures 132 are formed in the die attach region 130 and one aperture 132 is formed outside of the die attach region 130. Each aperture 132 passes entirely through the die attach region 130 of the lead frame structure 104. In this example, the apertures 132 are in the form of elongated slots. Each slot-shaped aperture 132 is oriented parallel to the orientation of each of the source leads 106(a)-106(f) and the gate lead 110(a). Each aperture 132 is also disposed between rows of adjacent solder joints in the Solder joint array 123. As shown in FIG. 1(a), the semiconductor die 118 is mounted over at least some of the apertures 132.

As will be described in further detail below, the solder joints 123 may be present in a number of grooves (not shown in FIG. 1(a)) formed in the leadframe structure 106. The grooves may be longitudinal grooves that are parallel to the apertures 132.

Instead of solder joints 123, other joints could be used. For example, conductive studs that are formed by a wirebonding process (e.g., as described in U.S. Pat. No. 5,633,204, which is herein incorporated by reference in its entirety) could be used instead of or in addition to solder joints 123. The conductive studs may comprise copper. Conductive columns like those described in U.S. patent application Ser. No. 09/881,787, filed on Jun. 15, 2001 could be used. This U.S. Patent Application is by the present inventors and is herein incorporated by reference in its entirety.

Figure 1B:
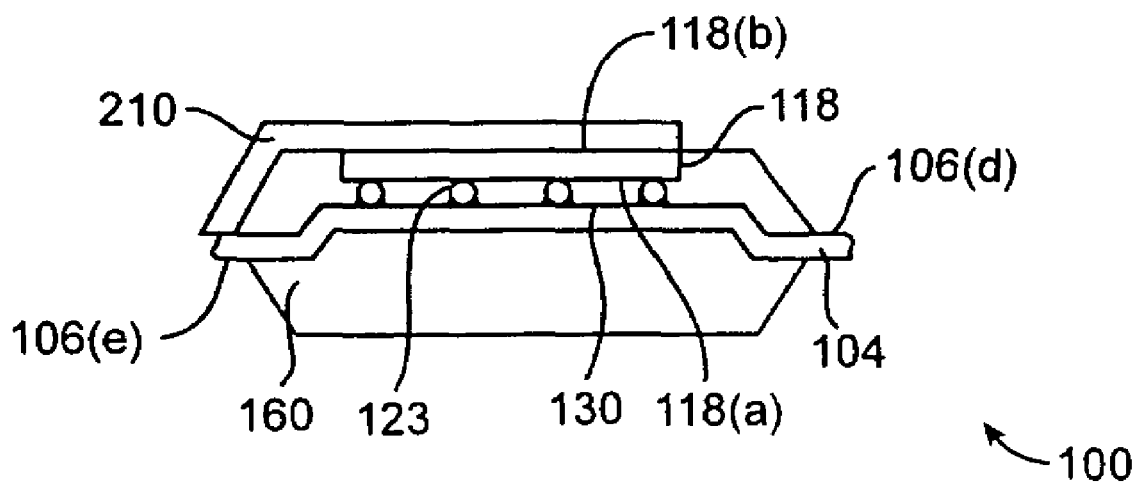
FIG. 1(b) shows a side view of the semiconductor on a leadframe structure shown in FIG. 1(a).

FIG. 1(b) shows the semiconductor die 118 on the leadframe structure 104 in a semiconductor die package. The semiconductor die 118 has a first surface 118(a) that is proximate to the lead frame structure 104 and a second surface 118(b) that is distal to the lead frame structure 104. The second surface 118(b) may correspond to the drain region of a MOSFET in the die 118, while source and the gate regions of the MOSFET may correspond to the first surface 118(a) of the semiconductor die 118.

A molding material 160 is around and covers at least a portion of the semiconductor die 118 and at least a portion of the die attach region 130 of the leadframe structure 104. Source leads 106(d), 106(e) extend laterally away from the molding material 160. In this example, the molding material 160 completely covers the die attach region 130 and the array of solder joints 123. The molding material 160 fills the apertures 132 in the die attach region 130 and also fills the spaces between the semiconductor die 188 and the leadframe structure 104. The molding material 160 does not cover the second surface 118(b) of the semiconductor die 118 in this example. Rather, the second surface 118(b) and the drain region of the MOSFET in the semiconductor die 118 are exposed through the molding material 160 so that the drain region can couple to a drain clip 210. The drain clip 210 provides for a conductive path from the drain region of the MOSFET to a circuit board (not shown) at the other side of the leadframe structure 104. The overall die package shown in FIG. 1(b) is thin and has good thermal dissipation properties. Low profile packages, specific leadframe structures, and specific drain clip structures are shown and described in U.S. patent application Ser. No. 10/271,654, filed Oct. 14, 2002, entitled "Thin, Thermally Enhanced Flip Chip In A Leaded Molded Package" by Rajeev Joshi and Chung-Lin Wu, which is herein incorporated by reference in its entirety for all purposes. Any of the features described therein can be used in embodiments of the invention.

The molding material 160 may comprise any suitable material. Suitable molding materials include biphenyl based materials, and multi-functional cross-linked epoxy resin composite materials. An exemplary material is Plaskon AMC2-RC mold resin, which is commercially available from Cookson Electronics of Alpharetta, Ga.

Figure 2A:
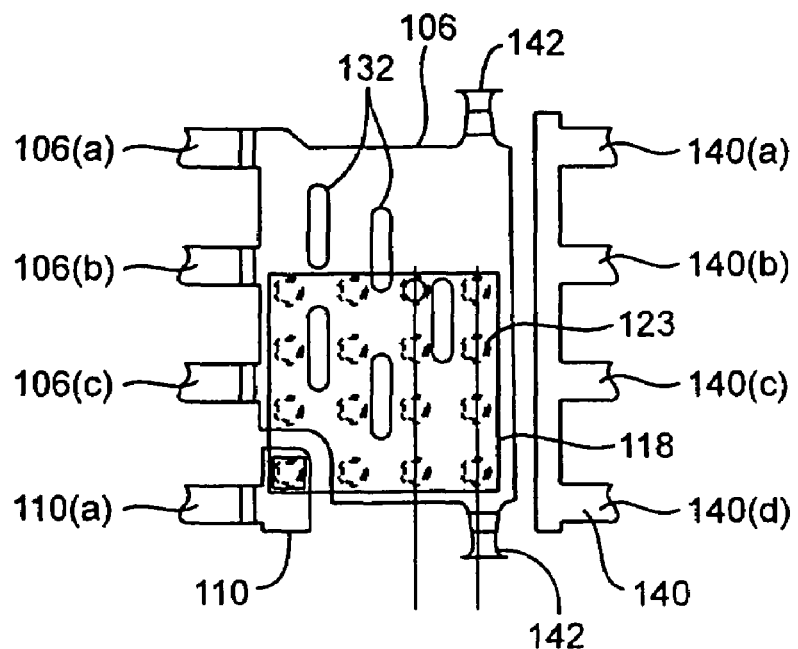
FIG. 2(a) shows a top view of a semiconductor die on a leadframe structure.

FIG. 2(a) shows a semiconductor die 118 mounted on a leadframe structure 140 via an array of solder joints 123. In this example, the lead frame structure 140 has a gate lead structure 110 with a gate lead 110(a), a source lead structure 106 with three source leads 106(a)-106(c), and a dummy lead structure 140 with four dummy leads 140(a)-140(d). The dummy lead structure 140 is not electrically connected to the semiconductor die 118 and provides structural support for the die package that is formed. Tie bars 142 are formed in the source lead structure 106. The tie bars 142 connect the leadframe structure 140 to other leadframe structures in an array of leadframe structures during processing.

In FIG. 2(a), the apertures 132 are also slots. Each slot-shaped aperture 132 is oriented generally perpendicular (i.e., about 90 degrees or at 90 degrees) to the orientation of each of the leads 106(a)-106(c), 110(a), 140(a)-140(d). Also, in this example, at least two of the slot-shaped apertures 132 are aligned end-to-end. The slot-shaped apertures 132 can have any suitable dimensions or pitch. For example, each slot can be about 0.2 mm wide and about 1.0 mm long, and the pitch of the slot-shaped apertures can be about 0.7 mm. In another example, each slot-shaped aperture can be about 0.2 mm wide and about 1.8 mm long.

As will be described in further detail below, the solder joints 123 may be present in a number of grooves (not shown in FIG. 2(a)) formed in the leadframe structure 106. The grooves may be longitudinal grooves that are parallel to the apertures 132.

Figure 2B:
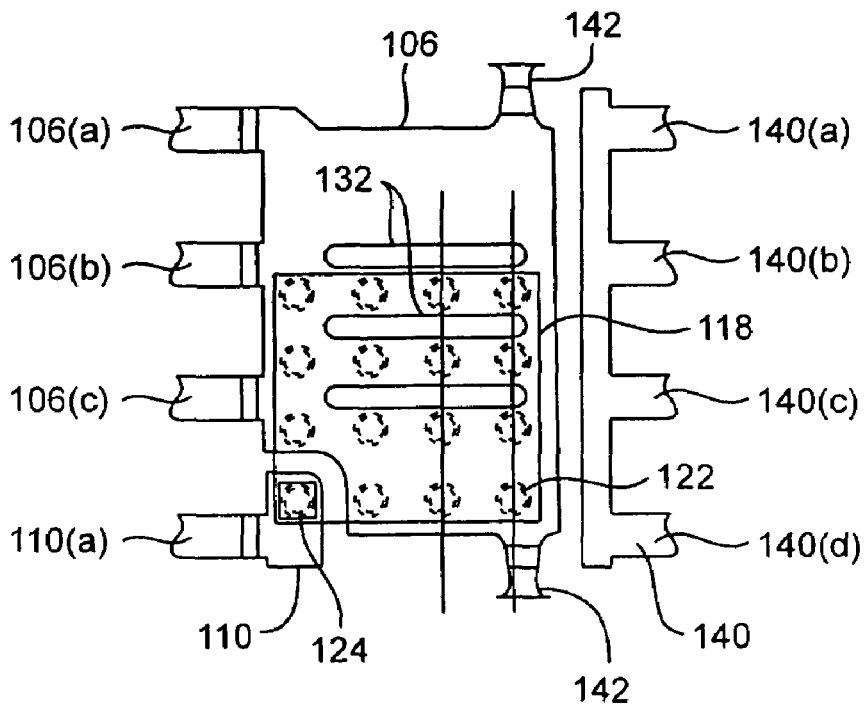
FIG. 2(b) shows a top view of a semiconductor die on a leadframe structure.

In FIG. 2(b), the apertures 132 are also slot-shaped, but are oriented parallel to the orientations of the leads 106(a)-106(c), 110(a), 140(a)-140(d). However, unlike the lead frame structure shown in FIG. 1, the lead frame structure 104 shown in FIG. 2(b) has a dummy lead structure 140.

A method for forming a die package can be described with respect to FIGS. 3(a)-3(l).

Referring to FIGS. 3(a) and 3(b), a leadframe structure 104 can be formed. Leadframe structures can be formed by, for example, a stamping process (known in the art). The leadframe structures can also be formed by etching a continuous conductive sheet to form a predetermined pattern. However, if stamping is used, the lead frame may originally be one of many lead frames in an array of lead frames that are connected together by tie-bars. During the process of making a semiconductor die package, the lead frame array may be cut to separate the lead frame from other lead frames. As a result of this cutting, portions of a lead frame structure in a final semiconductor die package such as a source lead and a gate lead may be electrically and mechanically uncoupled from each other. Thus, a lead frame structure in a semiconductor die package may be a continuous metallic structure or a discontinuous metallic structure.

The leadframe structure 104 includes a number of apertures 132. The apertures 132 can be formed using any suitable process including stamping, etching (wet or dry), etc. Before or after forming the apertures 132, the leadframe structure 104 can be coated with one or more layers of material. For example, the leadframe structure 104 may include a base metal such as copper or a copper alloy. The base metal may be coated with one or more underbump metallurgy layers. For example, NiPd may be pre-plated on a copper leadframe. The total thickness of the leadframe structure can vary. For example, in some embodiments, the thickness of the leadframe structure can be about 8 mils thick (or more or less than this).

As will be described in further detail below, the solder 123 may be present in a number of grooves (not shown in FIG. 3(b)) formed in the leadframe structure 104. The grooves may be longitudinal grooves that are parallel to the apertures 132.

After the leadframe structure 104 is formed, solder 123 can be deposited on the die attach region 130 of the lead frame structure 104. The solder 123 may comprise, for example, a solder paste such as 88Pb/10Sn/2Ag or 95Pb/5Sn (weight percentages of metals based on the weight of the solder). The solder 123 is deposited around the apertures 132. The solder 123 can be deposited on the leadframe structure 104 using any suitable process known in the art including pick and place, stenciling, electroplating, etc.

Referring to FIGS. 3(c) and 3(d), after depositing the solder 123 on the leadframe structure 104, a semiconductor die 118 is mounted on the die attach region 130. A "flip-chip" mounting process may be used. Accordingly, the semiconductor die 118 may be bumped with solder. Alternatively or additionally, the semiconductor die may have copper studs on them as described in U.S. patent application Ser. No. 09/881,787, filed Jun. 15, 2001, entitled "Semiconductor Die Including Conductive Columns" by Rajeev Joshi and Chung-Lin Wu, or as described in U.S. Pat. No. 5,633,204. Both of these references are herein incorporated by reference in their entirety for all purposes. As shown in FIG. 3(d), the second surface 118(b) of the semiconductor die 118 faces away from the leadframe structure 104.

Referring to FIGS. 3(e) and 3(f), after mounting the semiconductor die 118 on the leadframe structure 104, the solder 123 can be reflowed to form solder joints 123. Solder reflow processes are known in the art.

Figure 3G:
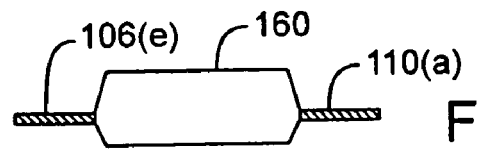
Figure 3H:
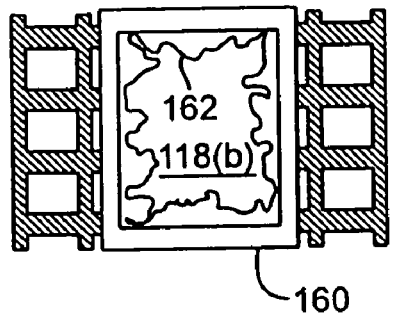

Referring to FIGS. 3(g) and 3(h), after the solder reflow step, a molding step can be performed. In some embodiments, a tape assisted molding process can be used to mold the molding the molding material around the semiconductor die, the gate lead structure, and the source lead structure. For example, a tape can be placed against the second side 118(b) of the semiconductor die 118 in the package precursor shown in FIGS. 3(e) and 3(f). Then, the combination can be placed in a molding cavity where a molding material is introduced. The molding material does not cover the second surface 118(b) of the semiconductor die 118, or the outward portions of the leads of the lead frame structure. The tape can be removed from the backside of the semiconductor die to thereby expose the backside of the die through the molded molding material. A tape assisted molding process is further described below with reference to FIGS. 4(a) and 4(b).

As shown, a molding material 160 is formed over a portion of the semiconductor die 118 and the die attach region 130 of the leadframe structure 104. As shown in FIG. 3(g), a source lead 106(e) and a gate lead 110(a) extend laterally away from the molded molding material 160. As shown in FIG. 3(h), there is excess molding material 162 on the second surface 118(b) of the semiconductor die 118.

Figure 3I:
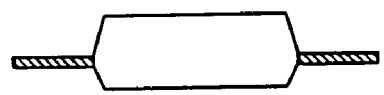
Figure 3J:
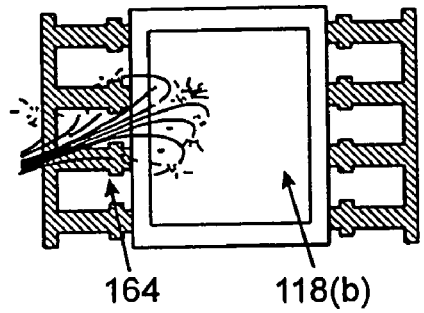

Referring to FIGS. 3(i) and 3(j), after molding the molding material, debar, deflash and dejunk processes can be performed. Deflash and dejunk processes that are known in the art can be used to remove excess molding material. As shown in FIG. 3(j), a waterjet 164 can be used to remove excess molding material from the second surface 118(b) of the semiconductor die 118. In a debar process, and as shown in FIG. 3(l), the connection to the gate lead 110(a) is severed to electrically isolate the gate lead from the source leads in the leadframe structure 104 for subsequent electrical test.

Figure 3K:
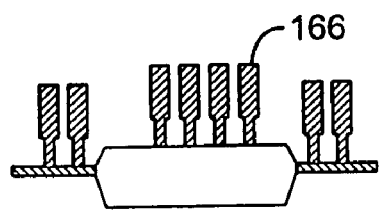
Figure 3L:
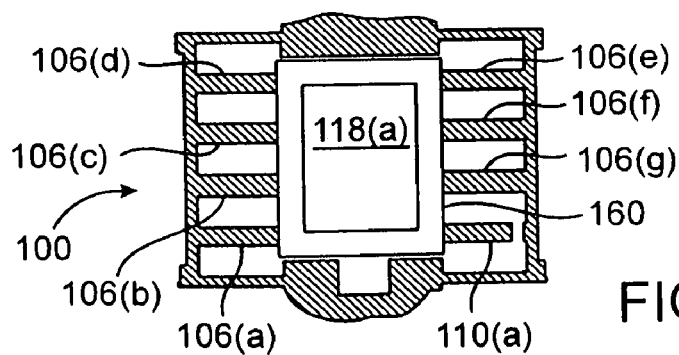

Referring to FIGS. 3(k) and 3(l), after dejunk, deflash, and debar, an electrical tester 166 can be used to electrically test the formed die package 100. If the die package 100 passes electrical test, the other individual source leads 106(a)-106(g) may be separated from each other.

As noted above, the leadframe structures have apertures in the die attach region. Providing apertures in the die attach region has a number of advantages. First, the molding material can easily flow into the regions between the solder joints coupling the leadframe structure and the semiconductor die by passing through the apertures. When the molding material fully infiltrates the region between the solder joints, and between the leadframe structure and the semiconductor die, the narrow spaces between the solder joints and between the semiconductor die and the leadframe structure fill with the molding material. The pressure on the solder joints is reduced as the molding material can fully encapsulate the solder joints. This reduces the likelihood that the solder joints will break and fail over time. Second, when the molding material passes into the apertures and solidifies, the solidified molding material "locks" to the leadframe structure, thus decreasing the likelihood of delamination between the leadframe structure and the molding material.

Apertures in the form of slots in the die attach region of a leadframe structure are preferred. These slots can reduce the likelihood of solder joint failure. For example, referring to FIG. 4(a), during molding, a leadframe structure 104 and a semiconductor die 118 can be placed in a molding apparatus 180 with two molding dies. The semiconductor die 118 is attached to the top molding die with double-sided tape 188. The lead frame structure 104 has a source lead structure 106 and a dummy lead structure 140 that are not mechanically coupled together. In the molding process, the molding dies close as shown in FIG. 4(b), and there is a 75 micron "drive-in" (D) that occurs in the leadframe structure 140 to ensure that the two molding dies are closed and the molding material does not escape the closed molding dies. As a consequence of this drive-in, the combination of the source lead structure 106 and the semiconductor die 118 act like a cantilever, which flexes. This flexing can cause cracking in a formed solder joint as shown in FIGS. 4(c) and 4(d). To reduce the flexing and increase the rigidity of the leadframe structure 104, the slot-shaped apertures 132 can be formed perpendicular to the orientations of the leads in the lead frame structure (as shown in FIG. 2(a)).

The slot-shaped apertures could alternatively be oriented so that they are parallel to the orientations of the leads in the leadframe structure. This may be desirable when the leadframe structure has no dummy leads, but has source leads on opposite sides as shown in FIG. 1(a). Referring again to FIG. 4(a), if the dummy lead 140 was a functional source lead like the source lead 106(f) in FIG. 1(a), then the two leads shown in FIG. 4(a) would be mechanically coupled together like the leadframe structure 106 shown in FIG. 1(a). In this case, during the molding process, when the top die closes, the leadframe structure may be too rigid and some flexing may be desirable to reduce the stress on the solder joints between the semiconductor die 118 and the lead frame structure 104. A more flexible lead frame structure 104 can be provided by orienting the slot-shaped apertures parallel to the orientations of the leads in the leadframe structure as shown in FIG. 1(a).

Accordingly, the leadframe structure may be comprised of one unit (e.g., a leadframe structure with a die attach pad and 7 source leads) or the leadframe structure may be comprised of two units (e.g., the leadframe structure may have one unit with 3 source leads while a second unit has dummy leads). The die attach pad (DAP) (or die attach region) can have different features. For example, for a 7 source lead leadframe structure (one unit), slots in the die attach pad are oriented 0 degrees to the leads. For a 3 source leadframe structrure (two units), slots in the die attach pad may be at 90 degrees to each of the leads. In either case, grooves (as described below) may be in the die attach pads.

Figure 5B:
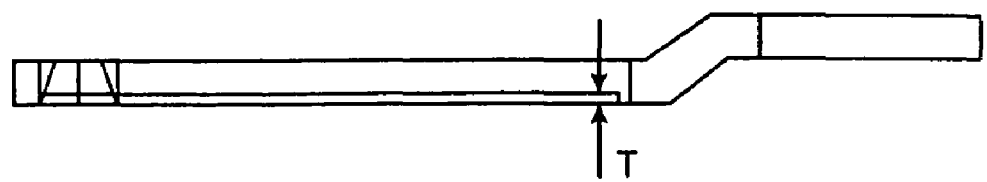
FIG. 5(b) shows a side cross-section view of the leadframe structure shown in FIG. 5(a) along the line 5(b)-5(b).
Figure 5A:
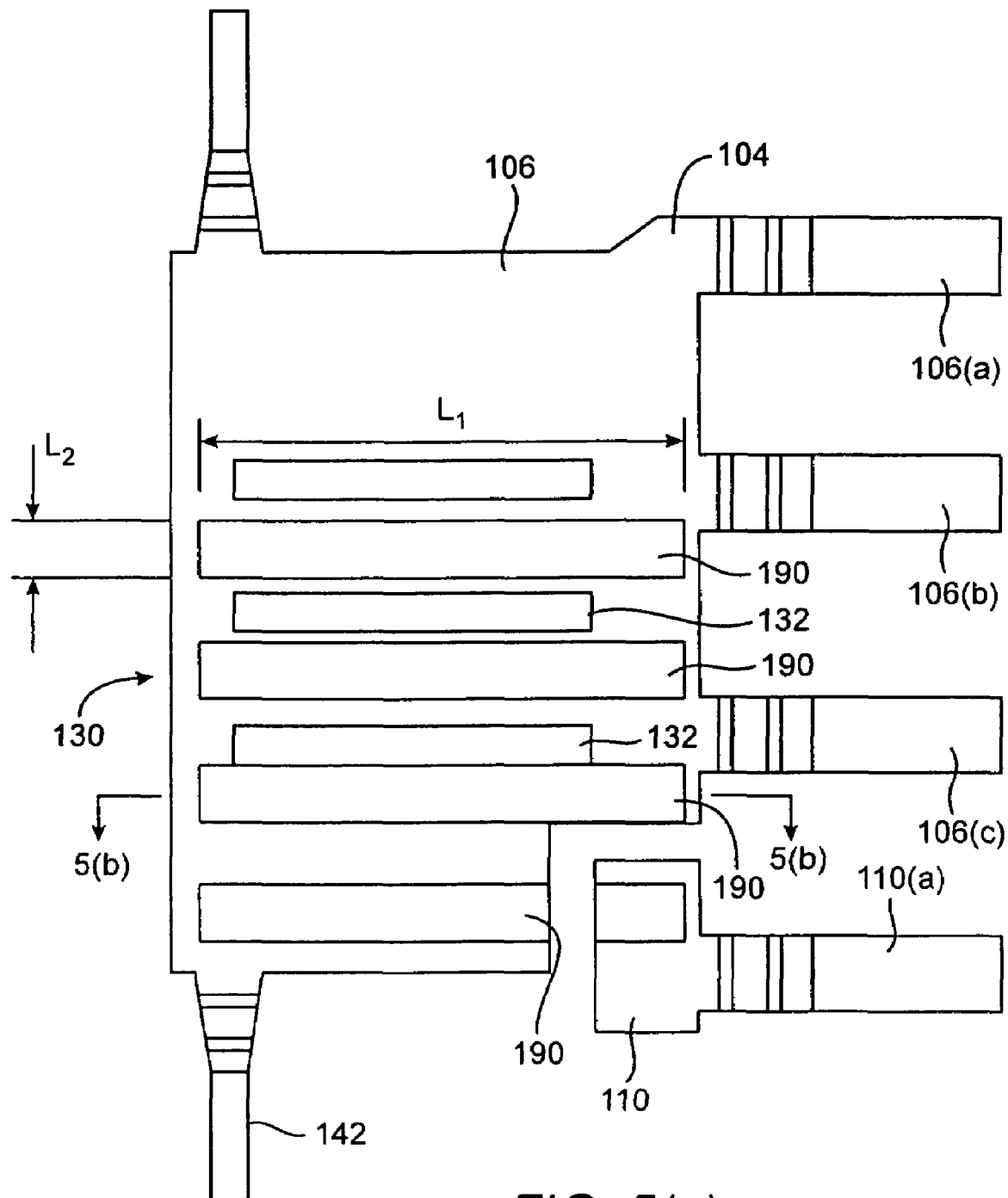
FIG. 5(a) shows a top plan view of a leadframe structure.

FIGS. 5(a)-5(b) show a leadframe structure 104 according to another embodiment of the invention. The leadframe structure 104 has a die attach region 130 and a plurality of source leads 106(a)-106(c) and a gate lead 110(a) that extend away from the die attach region 130. The die attach region 130 has a number of slot-shaped apertures 132 formed in it. A number of grooves 190 are respectively formed between adjacent slot-shaped apertures 132. These grooves 190 can receive the solder that is used to mechanically and electrically couple the semiconductor die (not shown in FIGS. 5(a)-5(b)) to the leadframe structure 104.

The grooves 190 may have any suitable depth, length, or width. For example, a groove may be 50 microns deep (or less) ("T" in FIG. 5(b)), about 0.3 mm wide (or more) ("$L_2$" in FIG. 5(a)), and greater than about 1 mm in length ("$L_1$" in FIG. 5(a)). The centerline of a groove may coincide with a solder bump on a semiconductor die that will be mounted on the die attach region. The grooves 190 may be present throughout the die attach region, or may only be in a particular portion of the die attach region.

Figure 6B:
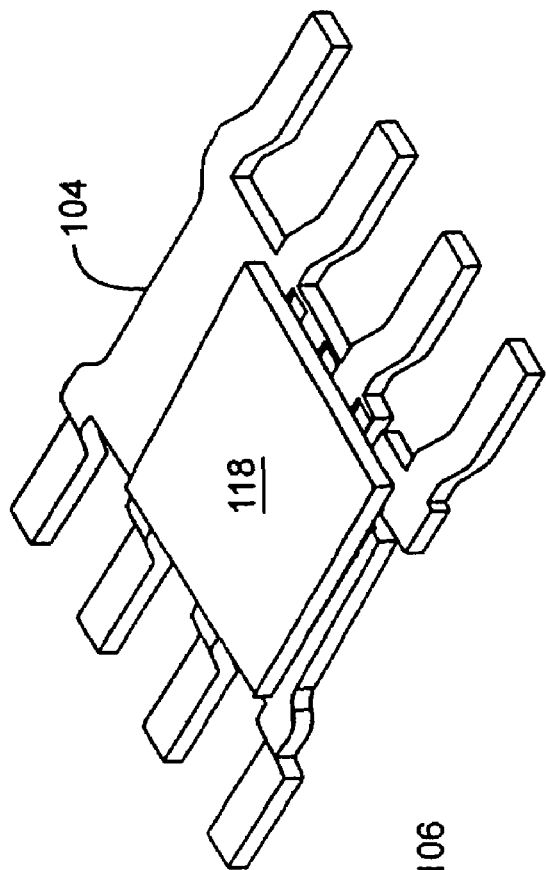
FIG. 6(b) shows a perspective view of a leadframe structure with a semiconductor die mounted to it.
Figure 6A:
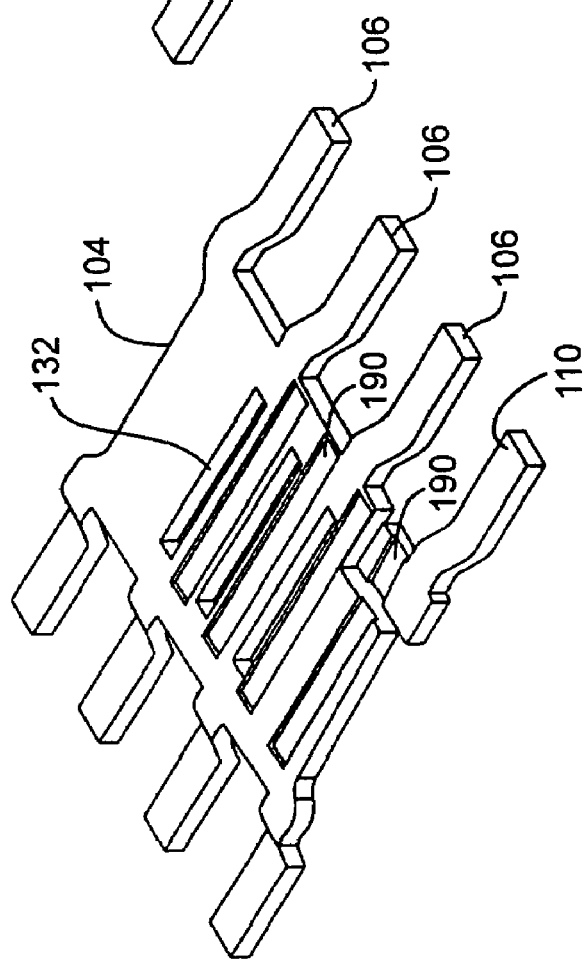
FIG. 6(a) shows a perspective view of a leadframe structure with apertures in the form of slots, and grooves.

FIG. 6(a) shows a perspective view of the type of lead frame structure 104 that is shown in FIGS. 5(a) and 5(b). FIG. 6(b) shows a perspective view of a semiconductor die 118 on the leadframe structure 104 shown in FIG. 6(a). After mounting the semiconductor die 118 on the leadframe structure 104, this combination may be further processed as previously described (e.g., molding, deflash, dejunk, test, etc.).

Figure 7:
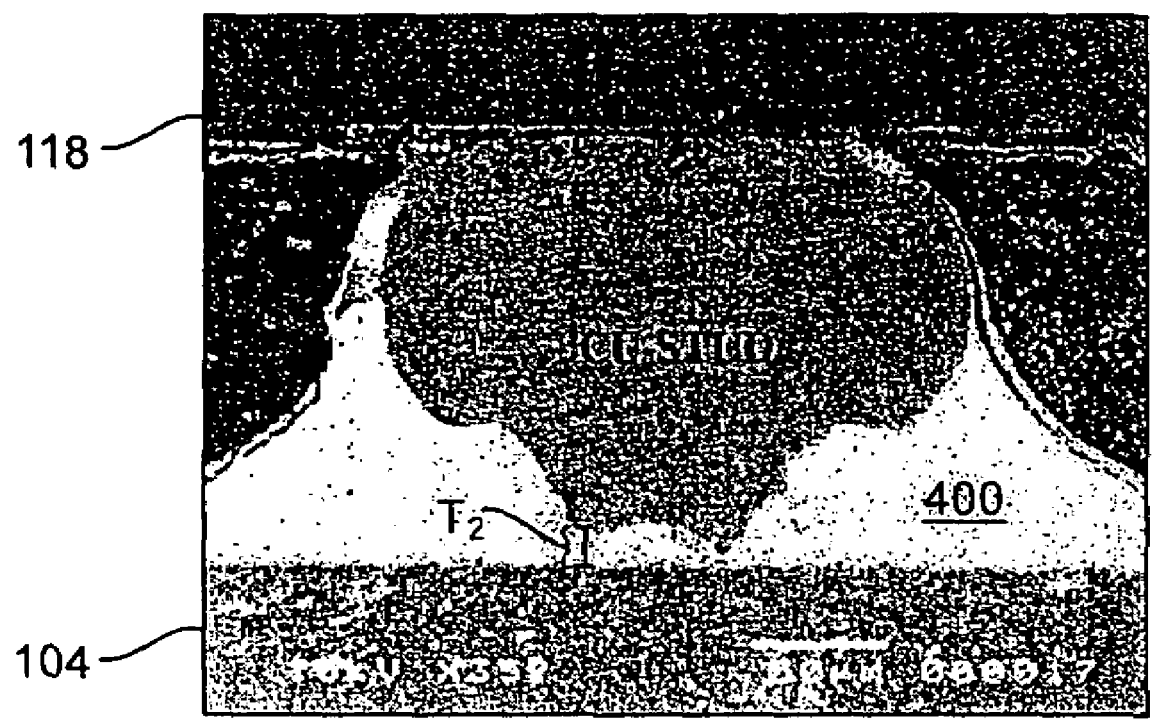
FIG. 7 shows a close-up view of a copper stud on a semiconductor die that is mounted to a leadframe structure.

The embodiments shown in FIGS. 5(a)-5(b), and 6(a)-6(b) have other advantages. For example, if the semiconductor die 118 has copper bumps on its underside, the high rigidity copper bumps will squeeze the solder paste on the leadframe structure and will yield a 15 micron bond line thickness (see for example, the thickness "T2" in FIG. 7 which shows solder 400 on a leadframe structure 104 around a copper stud that is attached to a semiconductor die 118). This thin bond-line thickness may delaminate during the high pressure molding process. It also yields higher thermal stress at the two interfaces of the copper bump and the solder paste, and the solder paste and the leadframe structure. The grooves allow one to control the thickness of the solder used to attach the die and allows one to use more solder. This produces a stronger, compliant solder joint (during the molding process). The grooves also provide a known, repetitive pattern to align a bumped die to a leadframe structure during the flip-chip process. Thus, the grooves can also advantageously function as alignment marks.

FIG. 8 shows a table showing different tests that were applied to embodiments of the invention. Each of the samples that were tested had a 3-source lead configuration with slots that are perpendicular to the leads (as in FIG. 2(a)).

The columns in the table show different qualifying numbers and sample types. In the rows, "Unit level" means testing at the package level, and "Board level" means testing at the board level after mounting. "ACLV" means autoclave testing at 121 degrees C., 15 psig, 100% relative humidity, and precondition L-1 (level one). "TMCL" means temperature cycling at −65 to 150 degrees C., 15 minutes dwell, and precondition L-1 (level one). "TMCL" under "Board Level" means temperature cycling from −10 to 100 degrees C., and at a 15 minute dwell. "PRCL" means power cycle at 125 degrees C., 2 minutes on, and 2 minutes off. As shown by the data in the table, "0/79" indicates that zero samples out of 79 failed after the indicated testing was performed. Accordingly, embodiments of the invention are reliable under relevant testing conditions. These testing conditions are described in further detail in JEDEC Standard JESD22-A-102-C (Accelerated Moisture Resistance-Unbiased Autoclave); EIA/JEDEC Standard JESD22-A113-B (Preconditioning of Nonhermetic Surface Mount Devices Prior to Reliability Testing); JEDEC Standard JESD22-A104-B (Temperature Cycling); and EIA/JEDEC Standard EIA/JESD22-A105-B (Test Method A105-B, Power and Temperature Cycling). Each of these publications as well as any patents or patent applications described herein are incorporated by reference in their entirety for all purposes.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. For example, although slot-shaped apertures are described in detail, round holes could alternatively be used alone or in combination with slot-shaped apertures in some embodiments. Moreover, one or more features of any embodiment may be combined with one or more features of any other specifically described embodiment without departing from the scope of the invention.

What is claimed is:

1. A semiconductor die package comprising:
   a semiconductor die including a first surface and a second surface;
   a leadframe structure comprising a die attach region and a plurality of leads extending away from the die attach region, wherein the die attach region is attached to the first surface of the semiconductor die and includes one or more grooves in the die attach region, and wherein the semiconductor die is mounted on the die attach region of the leadframe structure using one or more conductive bumps each comprising a conductive material that is disposed in the one or more grooves, such that the one or more conductive bumps are within the one or more grooves;
   a molding material that is around at least portions of the die attach region of the leadframe structure and the semiconductor die; and
   a conductive structure attached to the second surface of the semiconductor die.

2. The semiconductor die package of claim 1 wherein the die attach region comprises at least one aperture extending through the die attach region.

3. The semiconductor die package of claim 2 wherein the aperture is in the form of a slot, the slot being oriented generally perpendicular to the leads in the plurality of leads.

4. The semiconductor die package of claim 2 wherein the aperture is in the form of a slot, the slot being oriented generally parallel to the leads in the plurality of leads.

5. The semiconductor die package of claim 1 wherein the semiconductor die comprises a vertical power MOSFET.

6. The semiconductor die package of claim 1 wherein the die attach region comprises a plurality of elongated grooves.

7. The semiconductor die package of claim 1 wherein an exterior surface of the molding material is substantially coplanar with a surface of the die.

8. The semiconductor die package of claim 1 wherein the leads extend outwardly from the molding material.

9. The semiconductor die package of claim 1 wherein the leadframe structure is plated.

10. The semiconductor die package of claim 1 wherein the leadframe structure comprises copper.

11. The semiconductor die package of claim 1 wherein an exterior surface of the molding material is substantially coplanar with a surface of the die, and wherein the semiconductor die package further comprises a clip that is attached to the substantially coplanar surfaces of the molding material and the die.

12. The semiconductor die package of claim 1 wherein the conductive material comprises solder.

13. The semiconductor die package of claim 1 wherein the conductive material comprises copper.

14. The semiconductor die package of claim 1 wherein at least a portion of the molding material is located between the die attach region of the leadframe structure and the first surface of the semiconductor die.

15. The semiconductor die package of claim 5 wherein at least two of the grooves in the plurality of grooves are parallel to each other.

16. The semiconductor die package of claim 1 wherein the leadframe structure includes a dummy lead structure.

17. The semiconductor die package of claim 1, wherein the centerline of one or more grooves coincides with the one or more bumps.

18. The semiconductor die package of claim 1, wherein the conductive structure comprises a conductive clip.

* * * * *